(12) United States Patent
Chan et al.

(10) Patent No.: US 8,320,129 B2
(45) Date of Patent: Nov. 27, 2012

(54) HEAT SINK MOUNTING FRAME APPLICABLE TO A VARIETY OF CIRCUIT BOARDS

(75) Inventors: Hung-Chou Chan, Taipei Hsien (TW); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 300 days.

(21) Appl. No.: 12/884,221

(22) Filed: Sep. 17, 2010

(65) Prior Publication Data

US 2011/0299249 A1 Dec. 8, 2011

(51) Int. Cl.
*H05K 7/20* (2006.01)
*F28F 7/00* (2006.01)

(52) U.S. Cl. ........ 361/707; 361/710; 361/709; 361/719; 165/185; 165/80.2; 165/80.3

(58) Field of Classification Search .................. 361/704, 361/709, 707, 710, 719; 165/185, 80.2, 80.3
See application file for complete search history.

(56) References Cited

U.S. PATENT DOCUMENTS

| | | | | |
|---|---|---|---|---|
| 5,579,827 A * | 12/1996 | Chung | .......................... | 165/80.3 |
| 6,272,014 B1 * | 8/2001 | Lo | .................. | 361/704 |
| 6,386,274 B1 * | 5/2002 | Wang et al. | .................. | 165/80.3 |
| 6,452,803 B1 * | 9/2002 | Liu | .............. | 361/704 |
| 6,519,150 B1 * | 2/2003 | Chen et al. | ..................... | 361/697 |
| 7,218,524 B2 * | 5/2007 | Yu et al. | ........................ | 361/719 |
| 7,283,362 B2 * | 10/2007 | Lin et al. | ....................... | 361/704 |
| 7,342,791 B2 * | 3/2008 | Lee et al. | ....................... | 361/704 |
| 2004/0017648 A1 * | 1/2004 | Tsubaki | .................... | 361/601 |
| 2008/0192427 A1 * | 8/2008 | Wu et al. | ...................... | 361/687 |
| 2009/0050308 A1 * | 2/2009 | Kuo | ............................ | 165/185 |

* cited by examiner

*Primary Examiner* — Bradley Thomas
(74) *Attorney, Agent, or Firm* — Altis Law Group, Inc.

(57) ABSTRACT

An exemplary heat sink mounting frame is for mounting a heat sink onto a circuit board. The heat sink mounting frame includes a circular guide rail, and mounting arms movably connected with and extending radially and outwardly from the guide rail. Each mounting arm includes a fixing bracket connected to the guide rail and a sliding bar slidably connected with the fixing bracket. An engaging post is formed on the sliding bar. The sliding bar is slidable along the fixing bracket, such that a total length of each of the mounting arms is variable to adjust the locations of the engaging posts of the mounting arms.

18 Claims, 7 Drawing Sheets

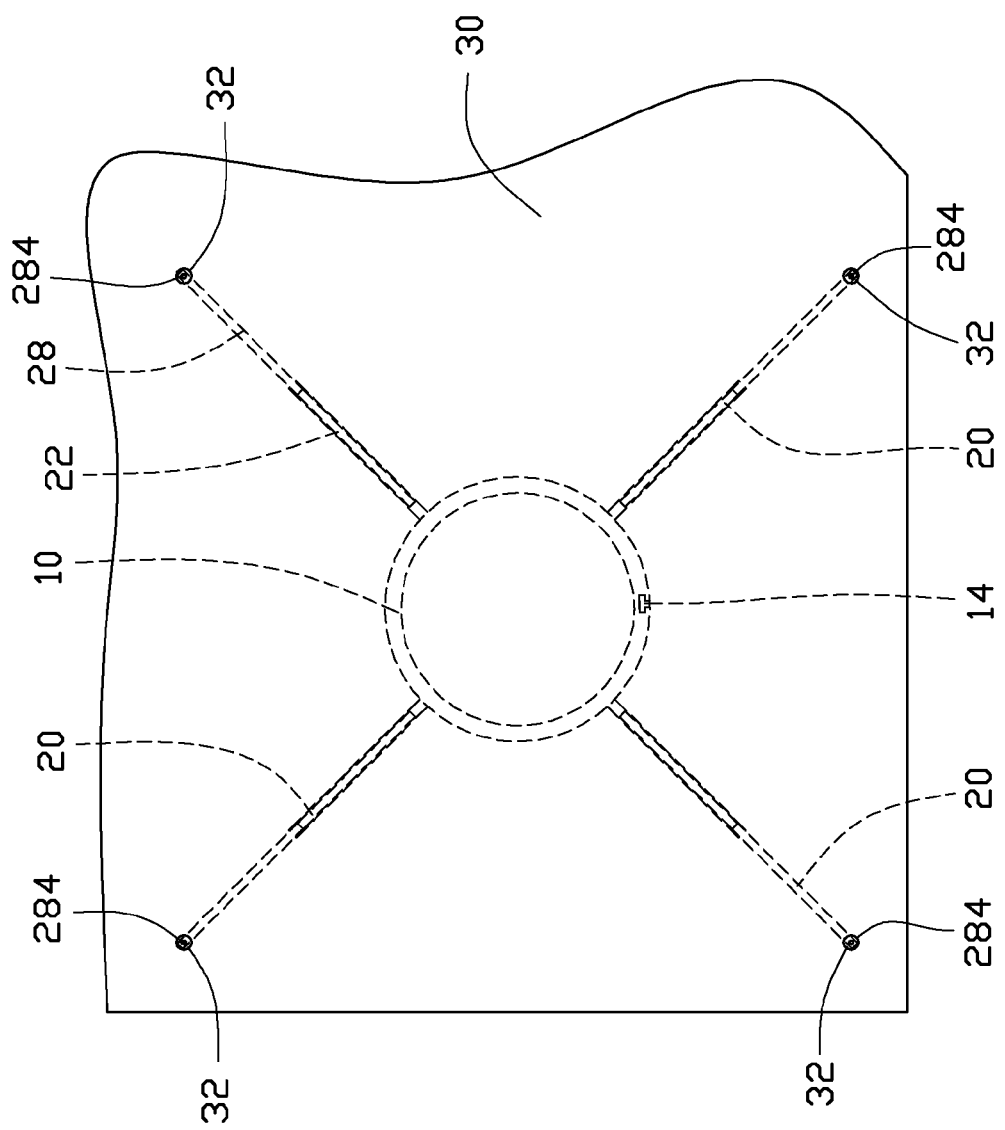

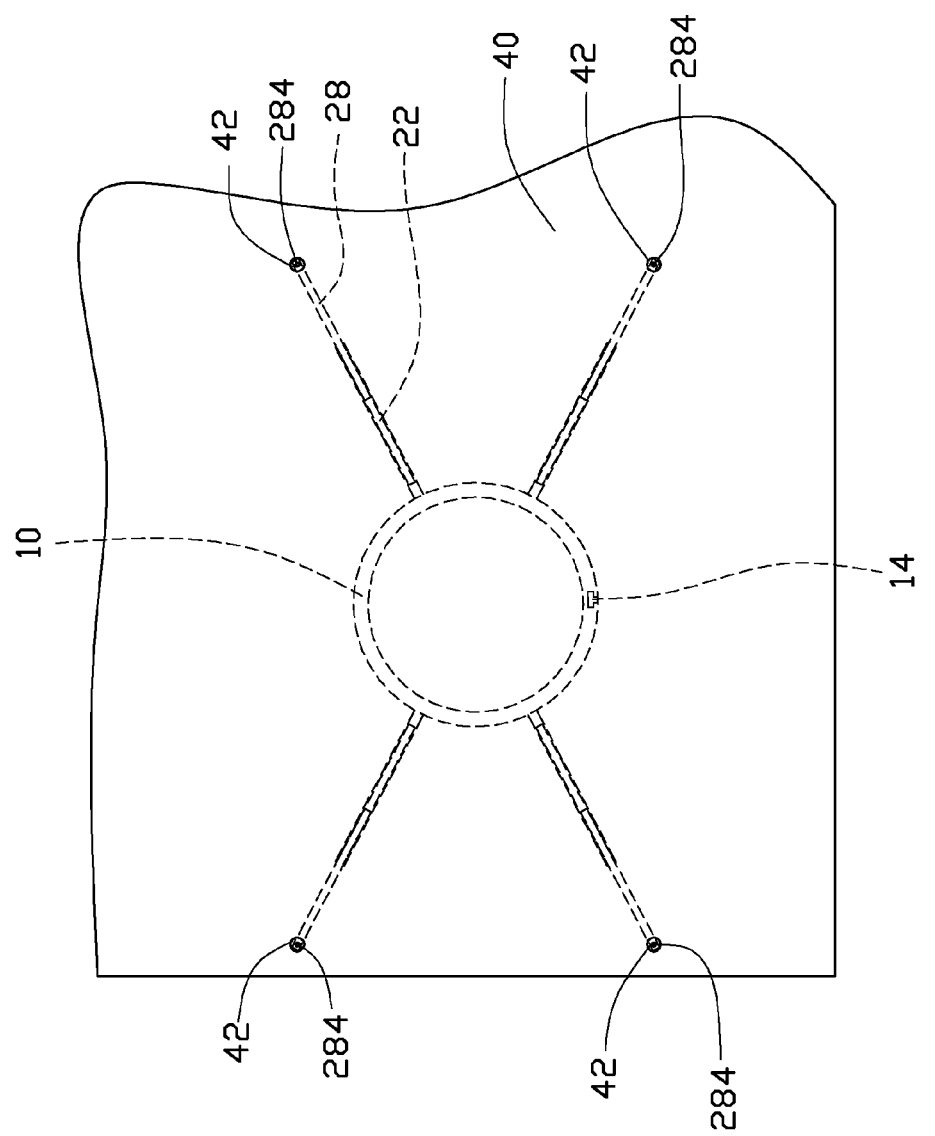

HEAT SINK MOUNTING FRAME APPLICABLE TO A VARIETY OF CIRCUIT BOARDS

BACKGROUND

1. Technical Field

The present disclosure relates to device cooling and, more particularly, to a heat sink mounting frame applicable to different circuit boards.

2. Description of Related Art

Heat sinks are commonly used in electronic devices, such as computers, for dissipating heat from electronic components thereof. Typically, a heat sink is secured to a circuit board on which the electronic components are mounted by a back plate. The back plate includes a plurality of mounting posts extending upwardly therefrom. The circuit board defines a plurality of mounting holes therethrough. The heat sink defines a plurality of through holes therein, corresponding to the mounting holes of the circuit board. The back plate is located below the circuit board, with the mounting posts of the back plate extending upwardly through the mounting holes of the circuit board, respectively. Screws are provided to extend through the through holes of the heat sink and thread into the mounting posts of the back plate, to secure the heat sink to the circuit board.

However, the locations of the mounting holes of circuit boards can vary. As the locations of the mounting posts of the back plate are unchangeable, it frequently happens that the back plate can only be dedicated to one particular circuit board.

Therefore, a mounting frame applicable to a variety of circuit boards is desired to overcome the described limitations.

BRIEF DESCRIPTION OF THE DRAWINGS

FIG. 6 is a top plan view, showing the mounting frame of FIG. 1 mounted to a back side of a circuit board.

FIG. 7 is similar to FIG. 6, but shows the mounting frame of FIG. 1 mounted to a back side of a circuit board different from that of FIG. 6.

DETAILED DESCRIPTION

Figure 1:
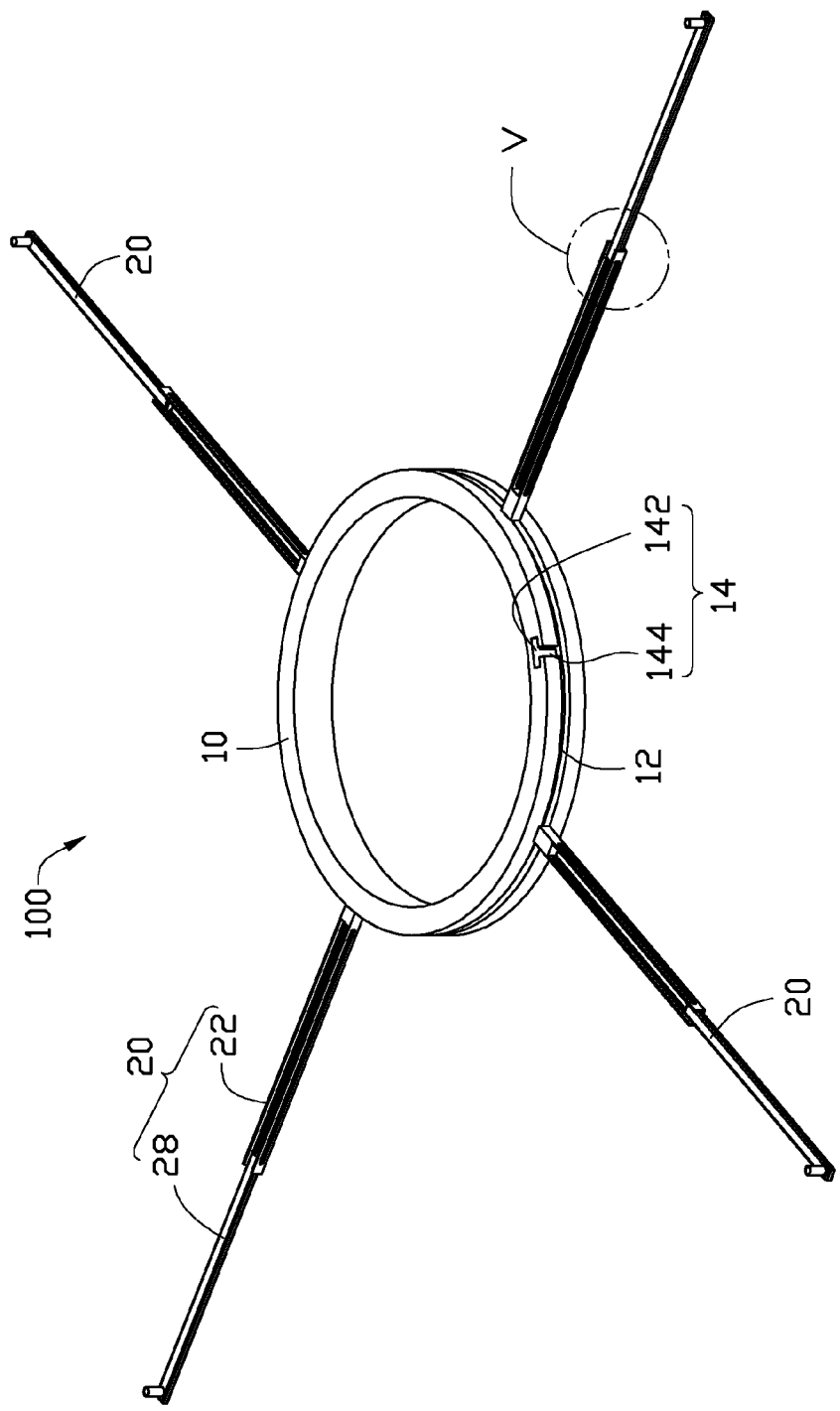
FIG. 1 is an assembled, isometric view of a mounting frame according to an exemplary embodiment.
Figure 2:
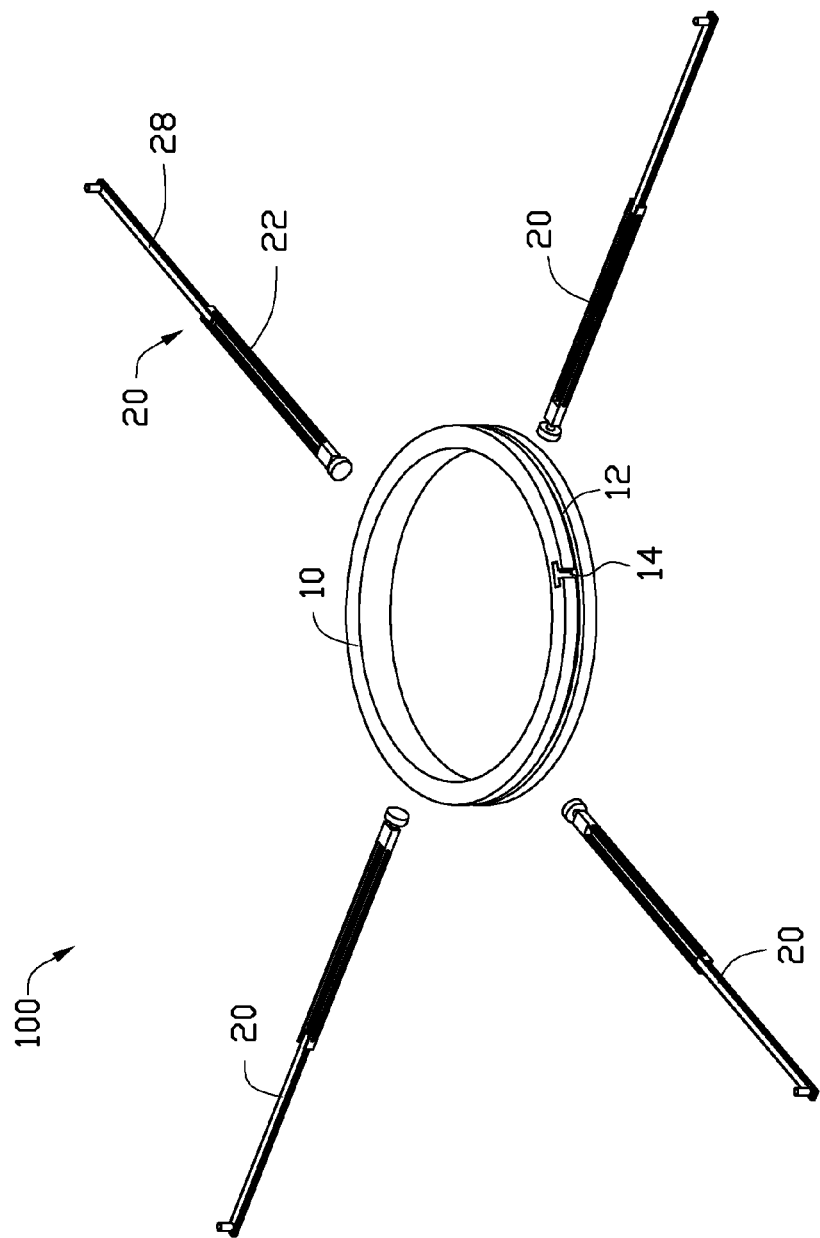
FIG. 2 is an exploded view of the mounting frame of FIG. 1.
Figure 3:
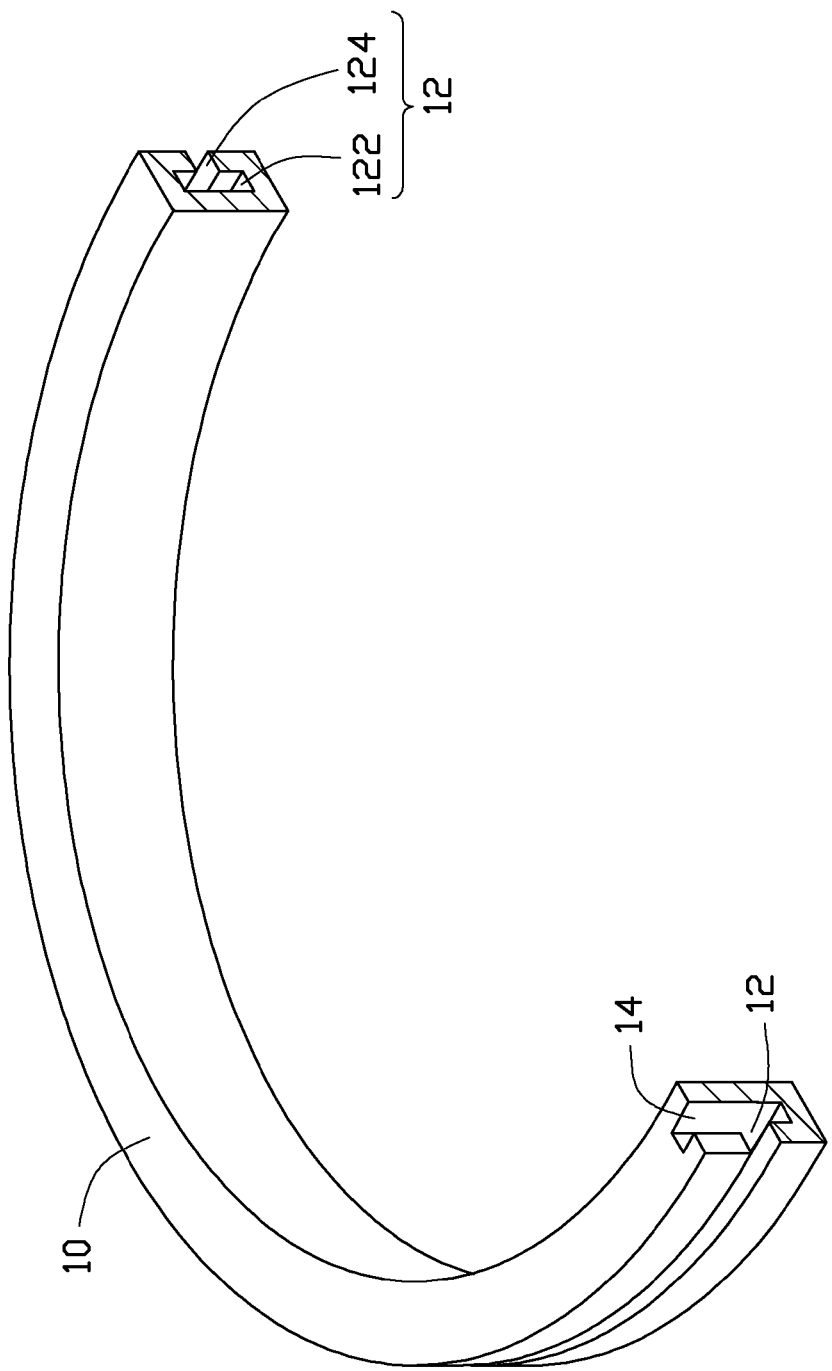
FIG. 3 is a cross-section of a guide rail of the mounting frame of FIG. 1.

Referring to FIGS. 1 and 2, an exemplary mounting frame 100 is shown. Referring also to FIGS. 6 and 7, the mounting frame 100 is capable of mounting a heat sink (not shown) onto a variety of circuit boards, for example circuit boards 30, 40. The mounting frame 100 includes a central guide rail 10 and four mounting arms 20 connected with and extending radially and outwardly from the guide rail 10. The guide rail 10 is circular, with a guide groove 12 defined therein along a circumference thereof. The guide groove 12 is concentric with the guide rail 10. Referring also to FIG. 3, the guide groove 12 is T-shaped in cross section, and includes a wide portion 122 and a narrow portion 124 adjoining the wide portion 122. The wide portion 122 runs deeper than the narrow portion 124. The wide portion 122 is located closer to an inner circumferential surface of the guide rail 10 than to an outer circumferential surface of the guide rail 10. The narrow portion 124 extends outwards from a middle of the wide portion 122 and through the outer circumferential surface of the guide rail 10. Thus, the narrow portion 124 of the guide groove 12 communicates with the exterior.

An entrance 14 is defined downwardly from the top surface of the guide rail 10. The entrance 14 communicates with the guide groove 12 and allows the mounting arms 20 to enter the guide groove 12. The entrance 14 is T-shaped, and includes an inner portion 142 located at an inner side of the guide rail 10 and an outer portion 144 located at an outer side of the guide rail 10. The outer portion 144 extends through the outer circumferential surface of the guide rail 10. The inner portion 142 is wider than the outer portion 144 as measured along the circumference of the guide rail 10. The inner portion 142 of the entrance 14 is aligned and communicates with the wide portion 122 of the guide groove 12, and the outer portion 144 of the entrance 14 is aligned and communicates with the narrow portion 124 of the guide groove 12.

Figure 4:
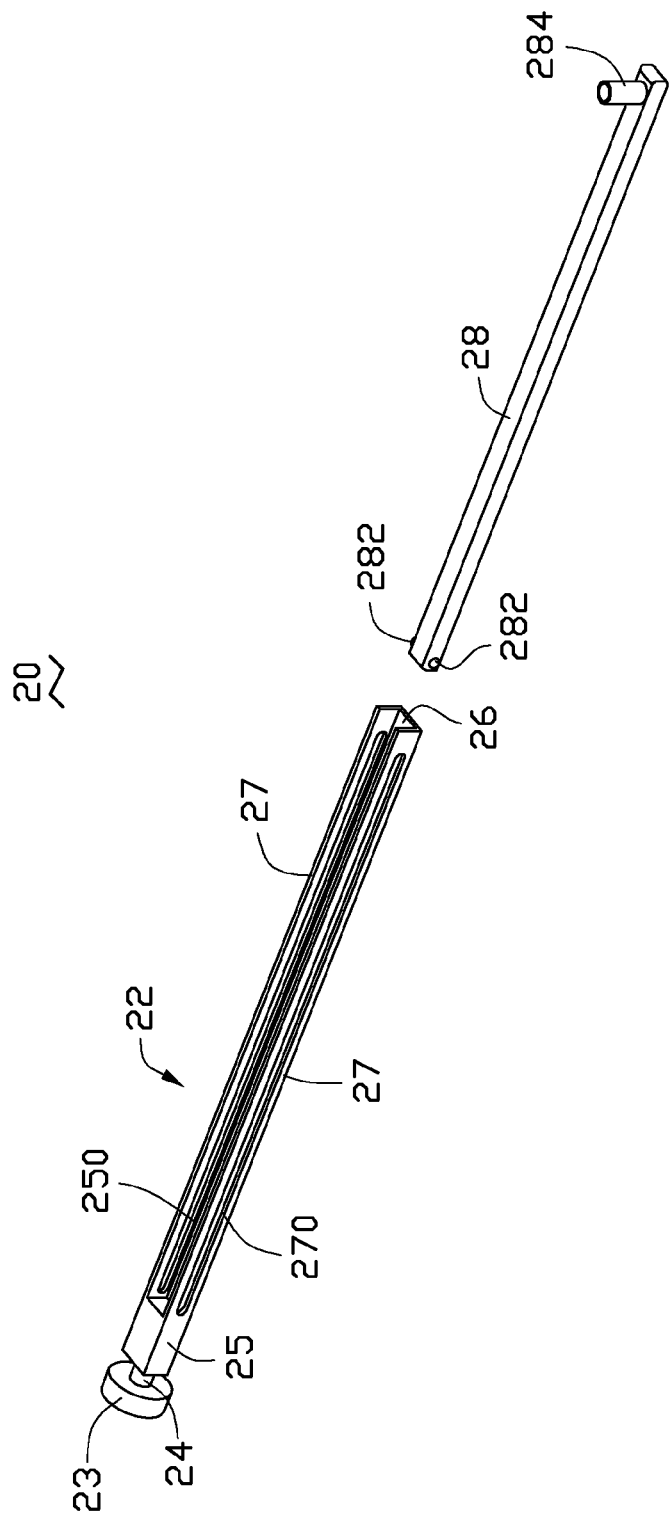
FIG. 4 is an exploded, isometric view of a mounting arm of the mounting frame of FIG. 1.
Figure 5:
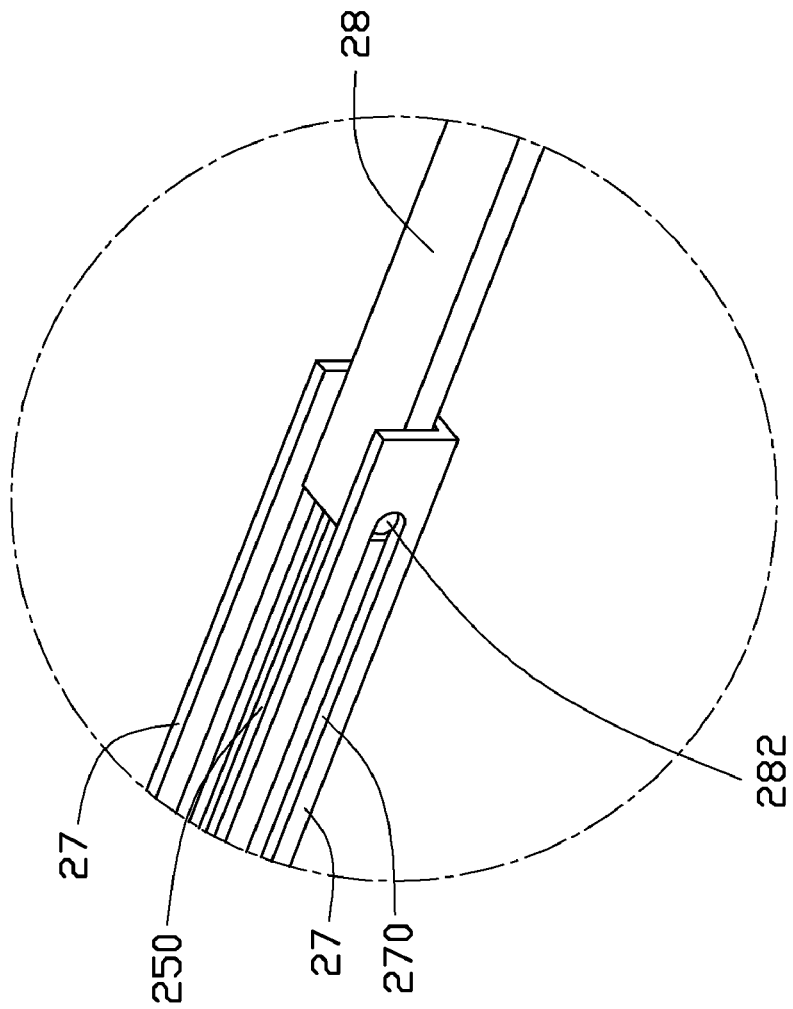
FIG. 5 is an enlarged view of the circled portion V of FIG. 1.

The mounting arms 20 have the same shape and structure. Referring also to FIGS. 4 and 5, each mounting arm 20 includes an elongated fixing bracket 22 connected with the guide rail 10, and an elongated sliding bar 28 connected with and slidable in the fixing bracket 22.

The fixing bracket 22 of each mounting arm 20 includes a head portion 23 at one end, a main portion 25 at the other end, and a neck portion 24 connected between the head portion 23 and the main portion 25. The head portion 23 is circular (or disk-shaped), and has a diameter less than the depth of the wide portion 122 of the guide groove 12 and the width of the inner portion 142 of the entrance 14 of the guide rail 10. The neck portion 24 is columned (or disk-shaped), and of a diameter less than the depth of the narrow portion 124 of the guide groove 12 and the width of the outer portion 144 of the entrance 14. Thus, the head portion 23 with the neck portion 24 is received in the guide groove 12 via the entrance 14, and accordingly, the head portion 23 is received and slidable in the wide portion 122 of the guide groove 12. The main portion 25 includes a bottom plate 26, and a pair of sidewalls 27 extending upwards from two opposite side edges of the bottom plate 26. The bottom plate 26 and the sidewalls 27 cooperatively define a receiving space 250 in the main portion 25 of the fixing bracket 22. Each sidewall 27 defines an elongated sliding groove 270 lengthways. Two ends of the sliding groove 270 are spaced from end faces of the main portion 250.

The sliding bar 28 is narrower than the receiving space 250 of the main portion 25 of the fixing bracket 22. Thus, the sliding bar 28 can be received in and slide along the receiving space 250 of the main portion 25 of the fixing bracket 22. An engaging post 284 is formed at an outer end of the sliding bar 28, for engaging with, e.g., a mounting hole 32, 42 of a circuit board 30, 40 (see FIGS. 6 and 7). The engaging post 284 is columned and hollow, with a thread hole (not labeled) defined therein. A pair of protrusions 282 protrude outwards from two opposite lateral sides of an inner end of the sliding bar 28, respectively. The protrusions 282 engage in the sliding grooves 270 of the sidewalls 27 of the fixing bracket 22, respectively, and the protrusions 282 are slidable along the sliding grooves 270. Thus, the sliding bar 28 is slidably received in the fixing bracket 22. Accordingly, a total length of the mounting arm 20 can be adjusted by sliding the sliding bar 28 along the fixing bracket 22, whereby a location of the engaging post 284 is adjustable.

Referring to FIG. 6, in assembly, the mounting frame 100 is positioned below the circuit board 30, with the engaging posts 284 of the mounting arms 20 extending upwardly through the mounting holes 32 of the circuit board 30, respectively. The circuit board 30 has a heat-generating electronic component (not shown) mounted thereon. A heat sink (not shown) is positioned above the electronic component on the circuit board 30. Fasteners or screws are provided to extend through the heat sink and engage with the engaging posts 284, to thereby fix the heat sink onto the electronic component on the circuit board 30.

Referring to FIG. 7, the circuit board 40 of FIG. 7 is different from the circuit board 30 of FIG. 6, with locations of the mounting holes 42 of the circuit board 40 different from the locations of the mounting holes 32 of the circuit board 30. Since the mounting arms 20 of the mounting frame 100 are slidable along the guide groove 12 of the guide rail 10, and the total length of each of the mounting arms 20 is adjustable, the locations of the engaging posts 284 are adjustable to match the locations of the mounting holes 42 of the circuit board 40. Thereby, the mounting frame 100 can be used to fix a heat sink (not shown) onto an electronic component (not shown) mounted on the circuit board 40. Thus, the mounting frame 100 is applicable to a variety of circuit boards, such as the circuit boards 30, 40.

It is to be understood, however, that even though numerous characteristics and advantages of exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink mounting frame for mounting a heat sink onto a circuit board, the heat sink mounting frame comprising:
    a circular guide rail; and
    a plurality of mounting arms movably connected with and extending radially and outwardly from the guide rail, each mounting arm comprising a fixing bracket movably connected to the guide rail and a sliding bar slidably connected with the fixing bracket, an engaging post formed on the sliding bar;
    wherein the sliding bar is received in and slidable along the fixing bracket, such that a total length of each of the mounting arms is variable to adjust the locations of the engaging posts of the mounting arms; and
    wherein a guide groove is defined in the guide rail along a circumference of the guide rail, the guide groove comprises a wide portion located closer to an inner circumferential surface of the guide rail than to an outer circumferential surface of the guide rail, and a narrow portion extending outwards from the wide portion and through the outer circumferential surface of the guide rail, the wide portion runs deeper than the narrow portion, and one end of the fixing bracket is received in the guide groove and slidable along the circumference of the guide rail.

2. The heat sink mounting frame of claim 1, wherein the guide groove of the guide rail is T-shaped in cross section.

3. The heat sink mounting frame of claim 1, wherein the guide rail defines an entrance communicating with the guide groove for allowing each mounting arm to enter the guide groove.

4. The heat sink mounting frame of claim 3, wherein the entrance is T-shaped.

5. The heat sink mounting frame of claim 1, wherein the fixing bracket comprises a head portion, a main portion and a neck portion connected between the head portion and the main portion, the head portion and the neck portion are received in the guide groove, with the head portion received in the wide portion of the guide groove and the neck portion received in the narrow portion of the guide groove.

6. The heat sink mounting frame of claim 5, wherein the head portion of the fixing bracket is circular with a diameter not exceeding a depth of the wide portion of the guide groove, and the neck portion of the fixing bracket is columned with a diameter not exceeding a depth of the narrow portion of the guide groove.

7. The heat sink mounting frame of claim 6, wherein a receiving space is defined in the main portion of the fixing bracket for the sliding bar, the main portion of the fixing bracket defines a pair of sliding grooves at two opposite sides thereof, and the sliding bar comprises a pair of protrusions received in and slidable along the sliding grooves of the fixing bracket, respectively.

8. The heat sink mounting frame of claim 7, wherein the main portion of the fixing bracket comprises a bottom plate, and a pair of sidewalls extending upwards from two opposite side edges of the bottom plate, the bottom plate and the sidewalls cooperatively define the receiving space, and the sliding grooves are defined in the sidewalls, respectively.

9. The heat sink mounting frame of claim 7, wherein the engaging post is formed at an outer end of the sliding bar, the protrusions are formed at an inner end of the sliding bar, the engaging post is columned and hollow, with a thread hole defined therein.

10. A heat sink mounting frame for mounting a heat sink onto a circuit board, the heat sink mounting frame comprising:
    a circular guide rail; and
    a plurality of mounting arms connected with and extending radially and outwardly from the guide rail, the mounting arms slidable along the guide rail, each mounting arm comprising a fixing bracket connected to the guide rail and a sliding bar connected with and slidable in the fixing bracket, an engaging post provided on the sliding bar;
    wherein the locations of the engaging posts of the mounting arms are adjustable by sliding the sliding bars and the mounting arms; and
    wherein a guide groove is defined in the guide rail along a circumference of the guide rail, the guide groove comprises a wide portion located closer to an inner circumferential surface of the guide rail than to an outer circumferential surface of the guide rail, and a narrow portion extending outwards from the wide portion and through the outer circumferential surface of the guide rail, the wide portion runs deeper than the narrow portion, and one end of the fixing bracket is slidable received in the guide groove along the circumference of the guide rail.

11. The heat sink mounting frame of claim 10, wherein the guide groove of the guide rail is T-shaped in cross section.

12. The heat sink mounting frame of claim 10, wherein the guide rail defines an entrance communicating with the guide groove for allowing each mounting arm to enter the guide groove.

13. The heat sink mounting frame of claim 12, wherein the entrance is T-shaped.

14. The heat sink mounting frame of claim 10, wherein the fixing bracket comprises a head portion, a main portion and a neck portion connected between the head portion and the main portion, the head portion and the neck portion are received in the guide groove, with the head portion received in the wide portion of the guide groove and the neck portion received in the narrow portion of the guide groove.

15. The heat sink mounting frame of claim 14, wherein the head portion is circular with a diameter not exceeding a depth of the wide portion of the guide groove, and the neck portion is columned with a diameter not exceeding a depth of the narrow portion of the guide groove.

16. The heat sink mounting frame of claim 15, wherein a receiving space is defined in the main portion of the fixing bracket for receiving the sliding bar, the main portion of the fixing bracket defines a pair of sliding grooves at two opposite sides thereof, and the sliding bar comprises a pair of protrusions received in and slidable along the sliding grooves of the fixing bracket, respectively.

17. The heat sink mounting frame of claim 16, wherein the main portion of the fixing bracket comprises a bottom plate, and a pair of sidewalls extending upwards from two opposite side edges of the bottom plate, the bottom plate and the sidewalls cooperatively define the receiving space, and the sliding grooves are defined in the sidewalls, respectively.

18. The heat sink mounting frame of claim 16, wherein the engaging post is formed at an outer end of the sliding bar, the protrusions are formed at an inner end of the sliding bar, and the engaging post is columned and hollow with a thread hole defined therein.

* * * * *

UNITED STATES PATENT AND TRADEMARK OFFICE
CERTIFICATE OF CORRECTION

PATENT NO.        : 8,320,129 B2
APPLICATION NO.   : 12/884221
DATED             : November 27, 2012
INVENTOR(S)       : Hung-Chou Chan and Zhen-Xing Ye Page 1 of 1

It is certified that error appears in the above-identified patent and that said Letters Patent is hereby corrected as shown below:

Title Page, below Item (65) insert:

-- (30)    Foreign Application Priority Data

Jun. 4, 2010   (CN) .................2010 1 0192064 --

Signed and Sealed this
Twenty-fourth Day of December, 2013

Margaret A. Focarino
*Commissioner for Patents of the United States Patent and Trademark Office*